United States Patent
Yoon et al.

[11] Patent Number: 6,117,766
[45] Date of Patent: Sep. 12, 2000

[54] METHOD OF FORMING CONTACT PLUGS IN A SEMICONDUCTOR DEVICE

[75] Inventors: Bo-Un Yoon, Seoul; In-Kwon Jeong, Kyunggi-do, both of Rep. of Korea

[73] Assignee: Samsung Electronics Co., Ltd., Suwon, Rep. of Korea

[21] Appl. No.: 09/149,485

[22] Filed: Sep. 8, 1998

[30] Foreign Application Priority Data

Sep. 8, 1997 [KR] Rep. of Korea ...................... 97-46200

[51] Int. Cl.$^7$ .............................................. H01L 21/4763
[52] U.S. Cl. .......................... 438/637; 438/633; 438/631; 438/626; 438/629; 438/622; 438/672
[58] Field of Search ........................... 438/637, 638–640, 438/687, 688, 667–668, 672–673, 622–631, 633

[56] References Cited

U.S. PATENT DOCUMENTS

| | | | |
|---|---|---|---|
| 5,026,666 | 6/1991 | Hills et al. | 438/301 |
| 5,960,310 | 9/1999 | Jeong | 438/622 |
| 5,963,837 | 10/1999 | Ilg et al. | 438/760 |

Primary Examiner—Charles Bowers
Assistant Examiner—Thanh Nguyen
Attorney, Agent, or Firm—Jones Volentine, LLC

[57] ABSTRACT

A method of forming contact plugs in a semiconductor device employing multiple steps of a selective polishing technique is provided. This method selectively removes an interlayer insulating film and a conductive layer, thereby providing layers polished with a CMP process improved planarity and uniformity. The method includes forming an interlayer insulating film over a semiconductor substrate having a plurality of diffusion regions and conductive layers. The interlayer insulating film has an uneven upper surface as deposited, following the contours produced by underlying structures formed on the semiconductor substrate. A contact hole is opened through the interlayer insulating film to expose an upper surface of a conductive layer or a semiconductor substrate in the first region. A second conductive layer is deposited over the resulting structure. The key step of the present invention is then accomplished by performing a plurality of selective polishing steps on the resulting structure.

14 Claims, 5 Drawing Sheets

6,117,766

METHOD OF FORMING CONTACT PLUGS IN A SEMICONDUCTOR DEVICE

FIELD OF THE INVENTION

The present invention relates to a method of fabricating a semiconductor device, and more particularly to a method of forming contact plugs using a multi-phase selective CMP process.

BACKGROUND OF THE INVENTION

FIGS. 1A to FIG. 1C are flow diagrams showing a conventional method of forming contact plugs.

Referring to FIG. 1A, a semiconductor substrate 10 is provided that has a cell array region "a" and a peripheral circuit region "b". Gate electrode layers 12 are formed in the cell array region "a". The gate electrode layers 12 includes polysilicon layer pattern 12a, a silicide layer pattern 12b, and an insulating spacer 12c, formed in that order over the semiconductor substrate 10. An interlayer insulating film 14 is then formed over the semiconductor substrate 10 including the gate electrode layers 12.

Note that the interlayer insulating film 14 has an uneven upper surface as it is deposited. In other words, because the interlayer insulating film 14 tends to be conformal, the upper surface of the interlayer insulating film 14 follows the contours producing by the underlaying structures formed on the semiconductors 10. This means that the position of the surface in the cell array region "a" and the peripheral circuit region "b" is very much different, causing a large step.

Referring to FIG. 1B, at least one contact hole 16 is opened through the interlayer insulating film 14 so as to expose an upper surface of the semiconductor substrate 10 proximate to the gate electrode layers 12. A conductive layer 18, for example a polysilicon layer is deposited over interlayer insulating film 14 to overfill the contact hole 16. The conductive layer 18 follows the topology produced by the underlaying insulating film layer 14.

Referring to FIG. 1C, the conductive layer 18, i.e., the polysilicon layer, and the interlayer insulating film 14 are both removed using a chemical-mechanical polishing (CMP) process in one step, thereby planarizing the interlayer insulating film 14 and forming a contact plug 20.

However, the above-mentioned CMP process must use slurries having no selectivity in the removal rate with respect to the polysilicon layer 18 and the interlayer insulating film 14, i.e., having the same removal rate, so as to remove simultaneously the polysilicon layer 18 and interlayer insulating film 14 through one step.

Thus, the conventional method mentioned above has many problems. The production of a slurry having the above-mentioned characteristics is difficult and controlling an end point of the CMP process is also difficult.

Furthermore, it is inevitable that the contact hole 16 is formed to have a deep depth. This is because the interlayer insulating film 14 of the cell array region "a" is formed very thickly so as to provide adequate margins for the CMP process.

In addition, one step of the CMP process used for removing a great deal of the interlayer insulating film 14 and the polysilicon layer 18 causes poor planarity and uniformity of the CMP layer.

Better margins for CMP process can be obtained by forming dummy gates in the peripheral circuit region "b" and planarizing the interlayer insulating film 14. However, the dummy gates affect the device, thus degrading electrical characteristics of the device.

SUMMARY OF THE INVENTION

The present invention is intended to solve the problems discussed above, and it is an object of the invention to provide a planarized polysilicon-insulator surfaces.

It is a further object of the invention to planarize the insulating layer.

It is yet another object of the invention to provide a method of forming contact plugs using a multi-phase selective CMP process.

The above and other objects in accordance with the present invention may be realized by providing a semiconductor substrate having first and second regions. A first conductive layer pattern is formed over the semiconductor substrate in the first region. An interlayer insulating film is then formed over the semiconductor substrate and the first conductive layer pattern, a second height of the interlayer insulating film in the second region being lower than a first height of the interlayer insulating film in the first region. A contact hole is then formed through the interlayer insulating film to expose the semiconductor substrate in the first region. Next, a second conductive layer is formed over the interlayer insulating film so as to overfill the contact hole. A first polishing step is performed on the second conductive layer so as to expose a first upper surface of the interlayer insulating film in the first region. Then, a second polishing step is performed on the interlayer insulating film in the first region using remaining portions of the second conductive layer in the second region as a mask, the second polishing step operating to polish the interlayer insulating film in the first region to a depth equal to the depth a second upper surface of the interlayer insulating film in the second region. Finally, a third polishing step is performed on the second conductive layer, thereby completely removing the second conductive layer from the second region.

In this method, the interlayer insulating film may comprise a material selected from a group consisting of $SiO_2$, USG, BPSG, SiN, SiON, SOG, FOX, and insulating polymers. If the interlayer insulating film comprises $SiO_2$, the interlayer insulating film is preferably formed via one of an LPCVD method, a PECVD method, and an HPD method. In addition, the second conductive layer may comprise a material selected from a group consisting of W, Cu, Al, W—Si, Al—Cu, Al—Cu—Si, and polysilicon.

The first, second, and third polishing steps may also be sequentially performed in one step by using a CMP apparatus including two or more platens. In the alternative, a fourth polishing step may be performed on the interlayer insulating film in the first and second regions, or a buffing step may be performed on the interlayer insulating film in the first and second regions.

The first conductive layer pattern may further comprise a polysilicon gate pattern, a silicide gate pattern formed over the polysilicon gate pattern, and an insulating spacer formed over the silicides gate pattern and the polysilicon gate pattern.

The above and other objects in accordance with the present invention may also be realized by providing a semiconductor substrate having first and second regions, forming a first conductive layer pattern over the semiconductor substrate in the first region, forming an interlayer insulating film over the semiconductor substrate and the first conductive layer pattern, a second height of the interlayer insulating film in the second region being lower than a first height of the interlayer insulating film in the first region, and forming a contact hole through the interlayer insulating film to expose the first conductive layer pattern in the first region, and forming a second conductive layer over the interlayer insulating film so as to overfill the contact hole. A first polishing step is performed on the second conductive layer so as to expose a first upper surface of the interlayer insulating film in the first region; a second polishing step is performed on the interlayer insulating film in the first region using remaining portions of the second conductive layer in the second region as a mask; and a third polishing step is performed on the second conductive layer, thereby completely removing the second conductive layer from the second region.

A fourth polishing step may also be performed on the interlayer insulating film in the first and second regions, or the second and third polishing steps may be repeated in turn so as to form a planar interlayer insulating film. The first, second, and third polishing steps may also be sequentially performed in one step by using a CMP apparatus having two or more platens.

The interlayer insulating film may comprise a material selected from a group consisting of $SiO_2$, USG, BPSG, SiN, SiON, SOG, FOX, and insulating polymer layers. The second conductive layer may comprise a material selected form a group consisting of W, Cu, Al, W—Si, Al—Cu, Al—Cu—Si, and poly—Si layers.

BRIEF DESCRIPTION OF THE DRAWINGS

The invention may be understood and its objects will become apparent to those skilled in the art by reference to the accompanying drawings as follows.

DESCRIPTION OF THE PREFERRED EMBODIMENTS

Preferred embodiments of the present invention will now be described with reference to the accompanying drawings, FIGS. 2A to 2F and FIGS. 3A to 3F. FIGS. 2A to FIG. 2F are flow diagrams showing a method of forming contact plugs in accordance with a first embodiment of the present invention.

Referring to FIGS. 2A to 2F, there is provided a semiconductor substrate 100 having a cell array region "a" and a peripheral circuit region "b". Gate electrode layers 102 are formed in the cell array region "a". The gate electrode layers 102 each include polysilicon layer pattern 102*a*, silicide layer pattern 102*b*, and insulating spacer 102*c* formed in that order over the semiconductor substrate 100. An interlayer insulating film 104 is then formed over the semiconductor substrate 100 including the gate electrode layers 102.

Note that the interlayer insulating film 104 has an uneven upper surface as it is deposited. This is because the interlayer insulating film 104 tends to be conformal, i.e, the upper surface of the interlayer insulating film 104 follows the contours producing by the underlaying structures formed on the semiconductors 100. In other word, the height of the surface in the cell array region "a" and the peripheral circuit region "b" differs greatly, causing a large step.

The interlayer insulating film 104 is preferably formed of one of: a $SiO_2$ layer, a USG (undoped silicate glass) layer, a BPSG (borophosphosilicate glass) layer, a PSG (phosphosilicate glass), a SiN (silicon nitride) layer, a SiON (silicon oxynitride) layer, a SOG (spin on glass) layer, a FOX (flowable oxide) layer, an insulating polymer, or a combination of these materials. The $SiO_2$ layer is preferably formed by a conventional method such as LPCVD (low pressure chemical vapour deposition), PECVD (plasma enhanced chemical vapour deposition), or HDP (high density plasma).

Figure 1A:
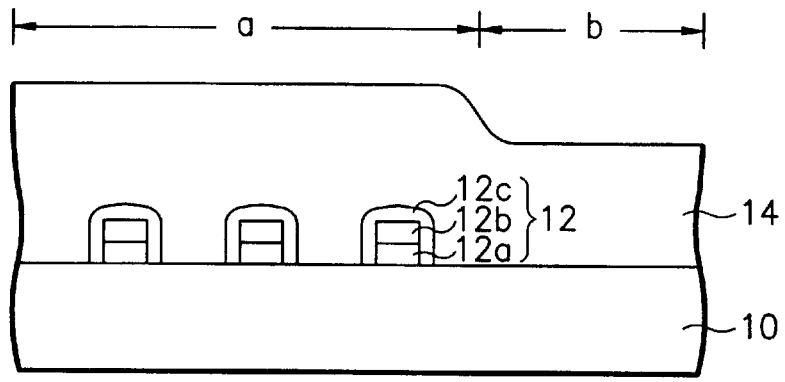
FIG. 1A to FIG. 1C are flow diagrams showing a conventional method of forming contact plugs.
Figure 1B:
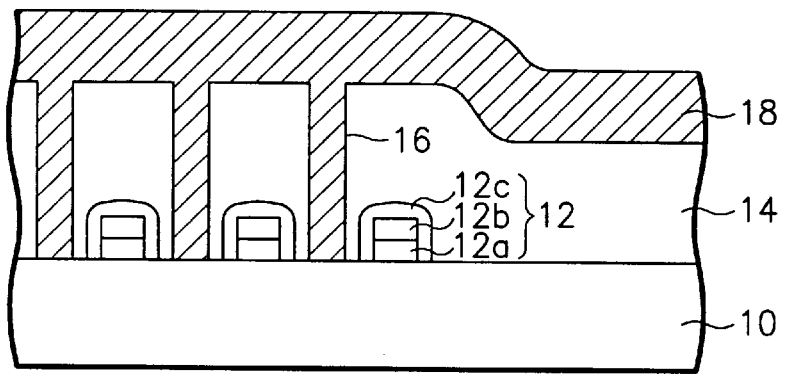
Figure 1C:
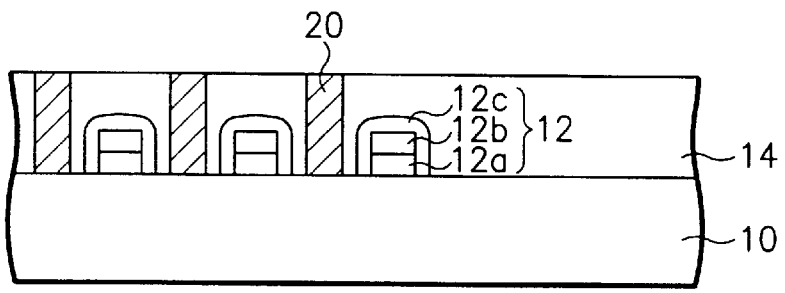
Figure 2A:
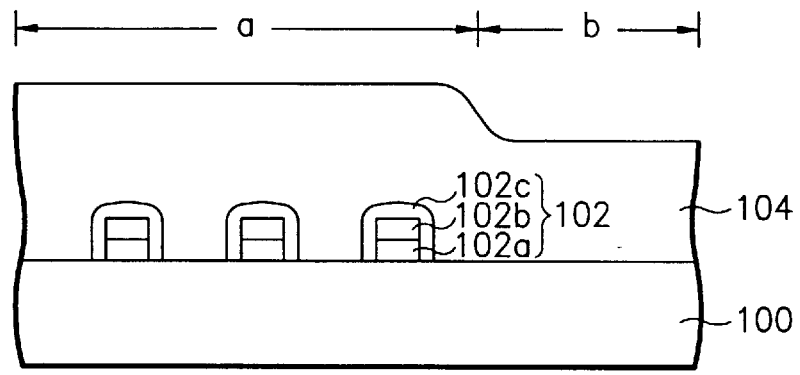
FIG. 2A to FIG. 2F are flow diagrams showing a method of forming contact plugs in accordance with a first embodiment of the present invention.
Figure 2B:
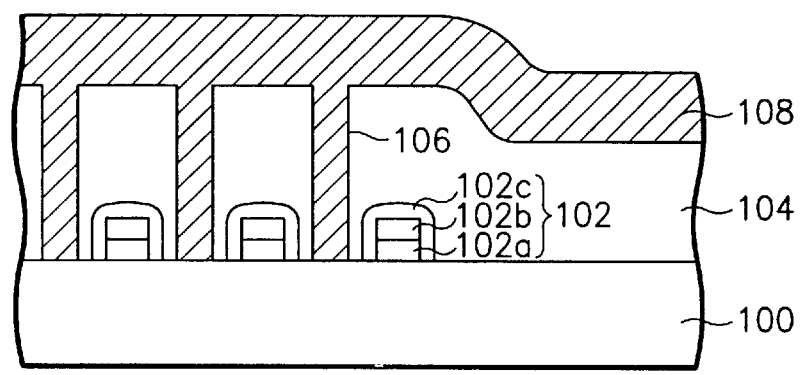

Referring to FIG. 2B, a contact hole 106 is opened through the interlayer insulating film 104 of the cell array region "a" so as to expose portions of the semiconductor substrate 100 proximate to the gate electrode layers 102. A conductive layer 108 is then deposited over the interlayer insulating film 104 to overfill the contact hole 106. The conductive layer 108 follows the topology produced by the underlaying layer 104 however, so it is also uneven. The conductive layer 108 preferably includes a metal layer such as W (tungsten), Cu (copper), Al (aluminum), metal alloy such as W—Si, Al—Cu, Al—Cu—Si, or a non-metal conductive material such as polysilicon. A polysilicon layer is used as the conductive layer 108 in the first preferred embodiment of the present invention.

Figure 2C:
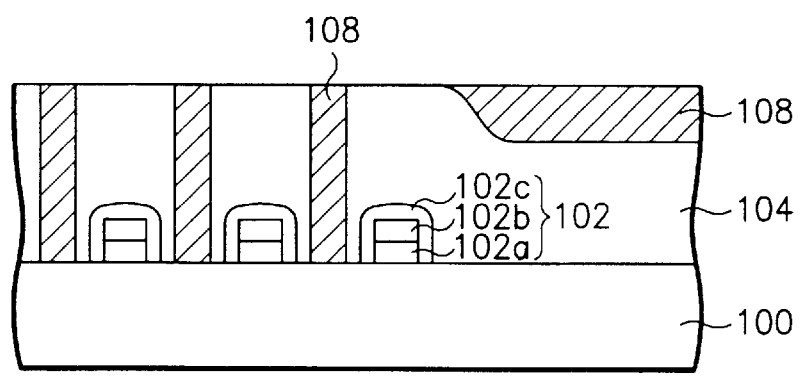

The following sequence process is critical to this invention. Referring to FIG. 2C, a first selective CMP process is conducted on the semiconductor substrate 100, thereby removing the polysilicon layer 108 over the cell array region "a" until an upper surface of the interlayer insulating film 104 of the cell array region "a." The CMP process preferably uses commercial slurries selective to polysilicon. The interlayer insulating film 104 of cell array region "a" servers as an etching stopping layer since the friction force increases, providing the process an end point when the interlayer insulating film 104 of the cell array region "a" is exposed. On the other hand, the polysilicon layer 108 of the peripheral circuit region "b" remains.

Figure 2D:
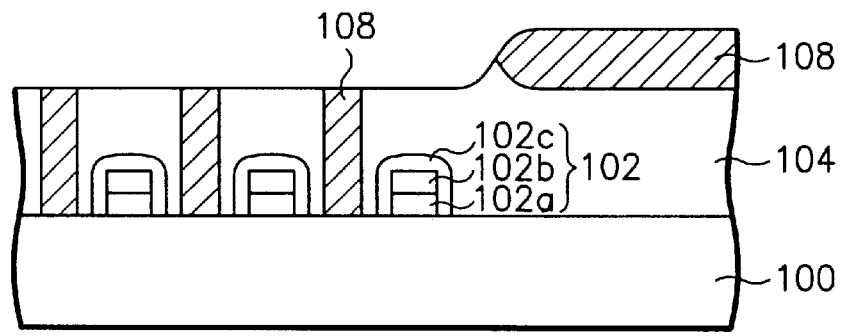

Referring to FIG. 2D, a second selective CMP process is conducted on the semiconductor substrate 100 so as to remove the interlayer insulating film 104 of the cell array region "a" at a position parallel to an upper surface of the interlayer insulating film 104 of the peripheral circuit region "b".

At this time, the polysilicon layer 108 in the contact hole 106 is slightly etched together with the interlayer insulating film 104 of the cell array region "a", thereby forming planar polysilicon-insulating layers.

The second CMP process conducted on the interlayer insulating film 104 preferably uses commercially slurries highly selective to the interlayer insulating film 104. Note that, the interlayer insulating film 104 of the peripheral region "b" is not removed because the interlayer insulating film 104 in the peripheral circuit region "b" is masked by the remaining polysilicon layer 108. Therefore, compared with the conventional method, it is possible that the interlayer insulating film 104 can be formed as thinly as possible.

Figure 2E:
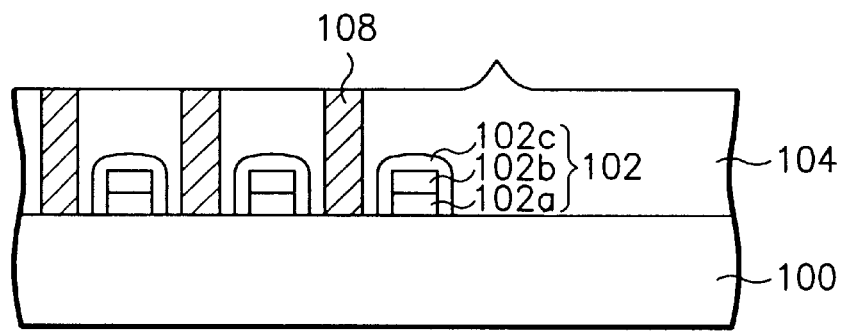

Referring to FIG. 2E, a third selective CMP process is conducted on the semiconductor substrate 100, thereby selectively removing the remaining polysilicon layer 108 to expose surfaces of the interlayer insulating film 104 beneath it. The third CMP process preferably uses commercial slurries highly selective to the polysilicon layer 108, i.e., having a high removal selectivity ratio with respect to the interlayer insulating film 104.

Figure 2F:
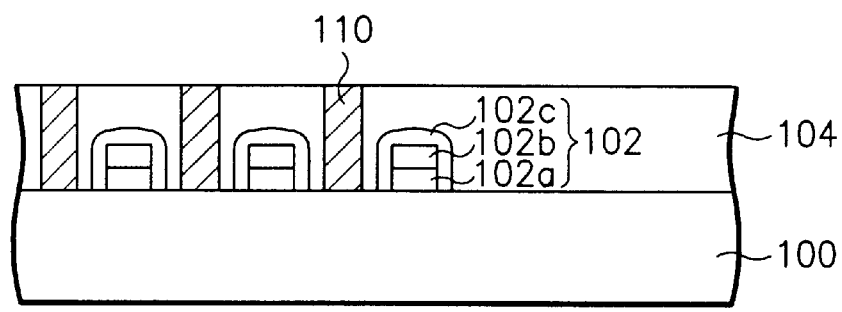

A fourth CMP process or buffing process is then conducted on the interlayer insulating film 104, thereby eliminating fine step coverage between the cell array region "a"

and the peripheral circuit region "b", and thereby forming a planarized polysilicon-insulator layer, i.e., planar contact plug 110 and planar interlayer insulating film 104, as shown in FIG. 2F.

In the alternative, after performing the first CMP process, as shown in FIG. 2C, the insulating layer selective CMP process conducted on the interlayer insulating film 104 of the cell array region "a" and the poly- selective CMP process conducted on the polysilicon layer 108 of the peripheral circuit region "b" can be repeatedly performed in turn so as to planarize the surface of the interlayer insulating film 104. The last step of CMP process can then be replaced by the buffing process.

The above-mentioned CMP process is preferably performed through one step by using multi-phase CMP apparatus having at least two platens. In the preferred embodiment, the multi-phase CMP apparatus has two platens, one used for removing the polysilicon and the other for removing the interlayer insulating film. In the case of four platens, the polishing process is carried out in the order of (poly CMP)—(insulating layer CMP)—(poly CMP)—(insulating layer CMP) and the kind of slurries used can be varied depending upon the step of the poly CMP process.

According to the method mentioned above, due to the use of a multi-phase selective CMP process, it is easy to control the CMP process and so sufficient time is provided for CMP margins due to a highly selective polysilicon CMP.

FIG. 3A to FIG. 3F are flow diagrams showing method of forming contact plugs in accordance with a second preferred embodiment of the present invention.

Figure 3A:
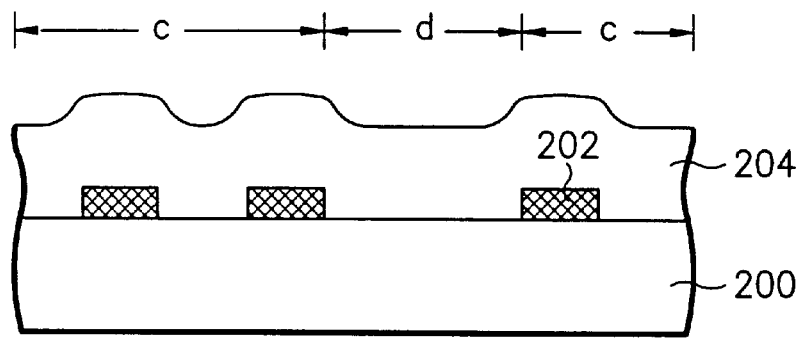
FIG. 3A to FIG. 3F are flow diagrams showing a method of forming contact plugs in accordance with a second embodiment of the present invention.

Referring to FIG. 3A, a metal line pattern 202 is formed on a semiconductor substrate 200, being spaced from another metal line. An interlayer insulating film 204 is formed over the semiconductor substrate 200 including the metal line pattern 202. The interlayer insulating film 204 is preferably formed of one of a SiO$_2$ layer, a USG (undoped silicate glass) layer, a BPSG (borophosphosilicate glass) layer, a PSG (phosphosilicate glass), a SiN (silicon nitride) layer, a SiON (silicon oxynitride) layer, a SOG (spin on glass) layer, a FOX (flowable oxide) layer, an insulating polymer, or a combination of two or more of these layers. The SiO$_2$ layer is preferably formed by conventional method such as a LPCVD (low pressure chemical vapour deposition), a PECVD (plasma enhanced chemical vapour deposition),or a HDP (high density plasma). The interlayer insulating film 204 follows contours produced by underlying structures (i.e., the metal line pattern), and thus has an uneven surface. In other words, the position of the surface in the region "c" where the metal line pattern 202 is formed below and the region "d" where a metal line pattern is not formed below is very different, causing a large step.

Figure 3B:
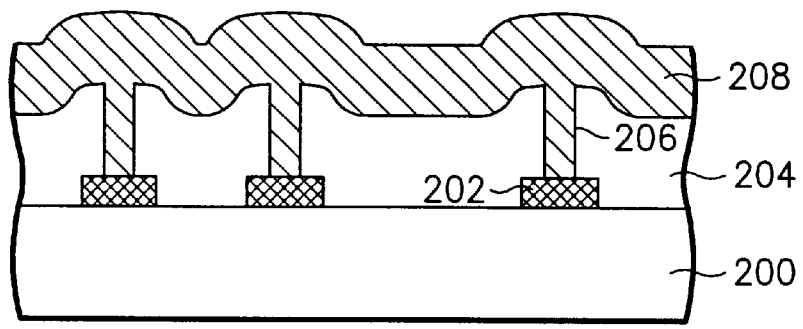

Referring to FIG. 3B, a via 206 is opened through the interlayer insulating film 204 to expose an upper surface of the metal line pattern 202. A conductive layer 208 is then deposited over the interlayer insulating film 204 to overfill the via 206. The conductive layer 208 preferably includes metal layer such as W (tungsten), Cu (copper), Al (aluminum), a metal alloy such as W—Si, Al—Cu, Al—Cu—Si, or a non-metal conductive material such as polysilicon. A tungsten layer is used as the conductive layer 208 in the second preferred embodiment of the present invention.

Figure 3C:
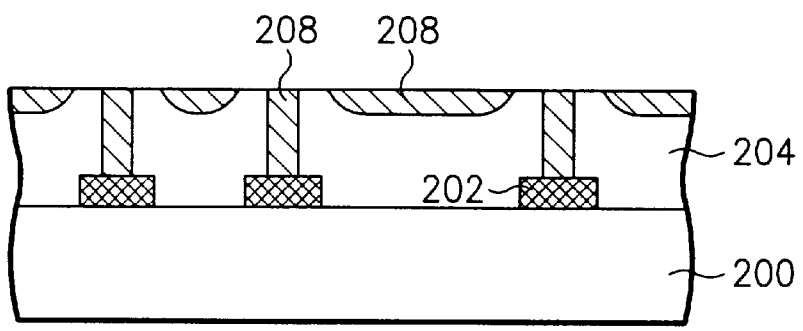

Referring to FIG. 3C, a first selective CMP process is conducted on the tungsten layer 208 until an upper surface of the interlayer insulating film 204 of region "c" having the metal line pattern 202 below is exposed. The first tungsten-CMP process preferably uses commercial slurries that are highly selective to the metal layer, i.e. highly selective to tungsten. After this process, portions of the tungsten layer remain in the region where a metal line pattern is not formed below, e.g., in the region "d".

Figure 3D:
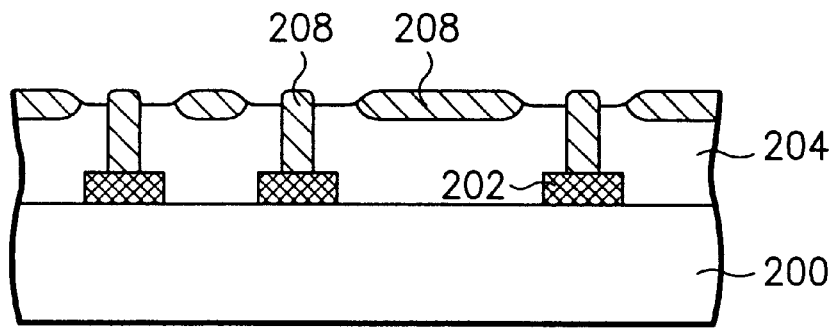

Referring to FIG. 3D, portions of the interlayer insulating film 204, which are exposed by the first CMP process, are then removed by a second selective CMP process. This second insulating-layer-CMP process preferably uses commercial slurries highly selective to the insulating layer, and uses the remaining tungsten layer 208 as a CMP mask. Due to this multi-phase selective CMP process, it is possible to form the interlayer insulating film 204 as thinly as possible.

Figure 3E:
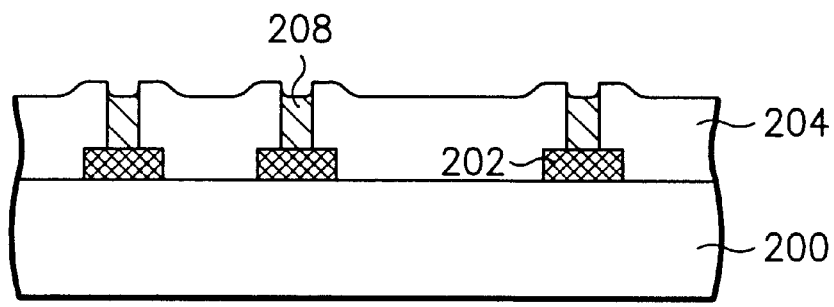

Referring to FIG. 3E, the remaining tungsten layer 208 is then selectively removed to expose surfaces of the interlayer insulating film 204 below by a third selective CMP process. The third selective CMP process preferably uses commercial slurries highly selective to the metal layer, i.e., highly selective to tungsten.

Figure 3F:
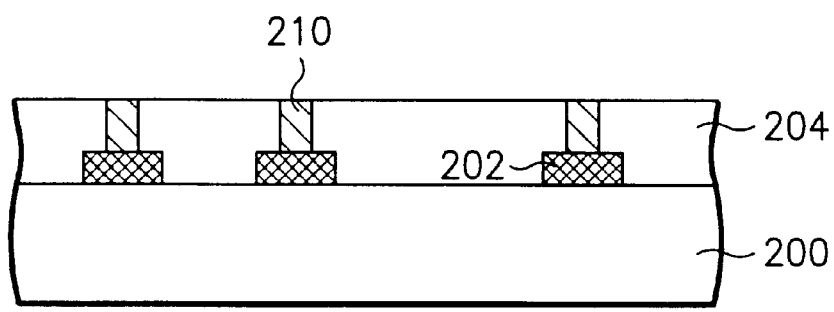

A fourth CMP process or a buffing process is then conducted on the interlayer insulating film 204, thereby forming planarized metal-insulator layer, i.e., planar via contact plug 210 and planar interlayer insulating film 204, as shown in FIG. 3F.

In the alternative, after performing the first CMP process, as shown in FIG. 3C, an insulating-layer-selective CMP process and a metal-layer-selective CMP process can be repeatedly performed in turn so as to planarize the surface of the interlayer insulating film 204. The last step of CMP process can then be replaced by the buffing process.

The above-mentioned CMP process can be performed in one step by using a multi-phase CMP apparatus having at least two platens in a similar manner to that mentioned above with regard to the first embodiment of the present invention.

According to the second embodiment of the present invention, it is unnecessary to form dummy gate electrode layers or dummy metal line patterns for initial planarization of the interlayer insulating film in the region where a metal line pattern is not formed below.

While this invention has been particularly shown and described with reference to the preferred embodiments thereof, it will be understood by those skilled in the art that various changes in form and details may be made without departing from the spirit and scope of this invention.

What is claimed is:

1. A method of forming contact plugs in a semiconductor device comprising the steps of:

providing a semiconductor substrate having first and second regions;

forming a first conductive layer pattern over the semiconductor substrate in the first region;

forming an interlayer insulating film over the semiconductor substrate and the first conductive layer pattern, a second height of the interlayer insulating film in the second region being lower than a first height of the interlayer insulating film in the first region;

forming a contact hole through the interlayer insulating film to expose the semiconductor substrate in the first region;

forming a second conductive layer over the interlayer insulating film so as to overfill the contact hole;

performing a first polishing step on the second conductive layer so as to expose a first upper surface of the interlayer insulating film in the first region;

performing a second polishing step on the interlayer insulating film in the first region using remaining portions of the second conductive layer in the second region as a mask, the second polishing step operating to polish the interlayer insulating film in the first region to a height equal to the second height of the interlayer insulting film in the second region; and performing a third polishing step on the second conductive layer, thereby completely removing the second conductive layer from the second region.

2. A method of forming contact plugs as recited in claim 1, wherein the interlayer insulating film comprises a material selected from a group consisting of $SiO_2$, USG, BPSG, SiN, SiON, SOG, FOX, and insulating polymers.

3. A method of forming contact plugs as recited in claim 1, wherein the interlayer insulating film comprises $SiO_2$, and the interlayer insulating film is formed via one of an LPCVD method, a PECVD method, and an HPD method.

4. A method of forming contact plugs as recited in claim 1, wherein the second conductive layer comprises a material selected from a group consisting of W, Cu, Al, W—Si, Al—Cu, Al—Cu—Si, and polysilicon.

5. A method of forming contact plugs as recited in claim 1, wherein the first, second, and third polishing steps are sequentially performed in one step by using a CMP apparatus including two or more platens.

6. A method of forming contact plugs as recited in claim 1, further comprises performing a fourth polishing step on the interlayer insulating film in the first and second regions.

7. A method of forming contact plugs as recited in claim 1, further comprises performing a buffing step on the interlayer insulating film in the first and second regions.

8. A method of forming contact plugs as recited in claim 1, wherein the first conductive layer pattern further comprises:

a polysilicon gate pattern;

a silicide gate pattern formed over the polysilicon gate pattern; and an insulating spacer formed over the suicides gate pattern and the polysilicon gate pattern.

9. A method of forming contact plugs in a semiconductor device comprising the steps of:

providing a semiconductor substrate having first and second regions;

forming a first conductive layer pattern over the semiconductor substrate in the first region;

forming an interlayer insulating film over the semiconductor substrate and the first conductive layer pattern, a second height of the interlayer insulating film in the second region being lower than a first height of the interlayer insulating film in the first region;

forming a contact hole through the interlayer insulating film to expose the first conductive layer pattern in the first region;

forming a second conductive layer over the interlayer insulating film so as to overfill the contact hole;

performing a first polishing step on the second conductive layer so as to expose a first upper surface of the interlayer insulating film in the first region;

performing a second polishing step on the interlayer insulating film in the first region using remaining portions of the second conductive layer in the second region as a mask; and performing a third polishing step on the second conductive layer, thereby completely removing the second conductive layer from the second region.

10. A method of forming contact plugs as recited in claim 9, further comprising the step of performing a fourth polishing step on the interlayer insulating film in the first and second regions.

11. A method of forming contact plugs as recited in claim 9, wherein the second and third polishing steps are repeated in turn so as to form a planar interlayer insulating film.

12. A method of forming contact plugs as recited in claim 9, wherein the interlayer insulating film comprises a material selected from a group consisting of $SiO_2$, USG, BPSG, SiN, SiON, SOG, FOX, and insulating polymer layers.

13. A method of forming contact plugs as recited in claim 9, wherein the second conductive layer comprises a material selected form a group consisting of W, Cu, Al, W—Si, Al—Cu, Al—Cu—Si, and poly—Si layers.

14. A method of forming contact plugs as recited in claim 9, wherein the first, second, and third polishing steps are sequentially performed in one step by using a CMP apparatus having two or more platens.

* * * * *